(12) United States Patent
Odell et al.

(10) Patent No.: US 9,543,821 B2
(45) Date of Patent: Jan. 10, 2017

(54) MOSFET DRIVER WITH PULSE TIMING PATTERN FAULT DETECTION AND ADAPTIVE SAFE OPERATING AREA MODE OF OPERATION

(71) Applicant: Power Integrations, Inc., San Jose, CA (US)

(72) Inventors: Arthur B. Odell, Morgan Hill, CA (US); Leif Lund, San Jose, CA (US); Sujit Banerjee, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 414 days.

(21) Appl. No.: 14/301,234

(22) Filed: Jun. 10, 2014

(65) Prior Publication Data

US 2015/0357904 A1     Dec. 10, 2015

(51) Int. Cl.
| | |
|---|---|
| *H02M 1/32* | (2007.01) |
| *H02M 3/335* | (2006.01) |
| *H03K 17/082* | (2006.01) |
| *H03K 17/16* | (2006.01) |
| *H03K 17/284* | (2006.01) |
| *H02M 1/00* | (2006.01) |

(52) U.S. Cl.
CPC .......... *H02M 1/32* (2013.01); *H02M 3/33515* (2013.01); *H03K 17/0822* (2013.01); *H03K 17/165* (2013.01); *H03K 17/284* (2013.01); *H02M 3/335* (2013.01); *H02M 2001/0045* (2013.01)

(58) Field of Classification Search
CPC ....................................................... H02J 1/102
USPC ....................................................... 307/140
See application file for complete search history.

(56) References Cited

U.S. PATENT DOCUMENTS

| | | |
|---|---|---|
| 7,113,413 B1 | 9/2006 | Khasiev |
| 2008/0290911 A1 | 11/2008 | Williams |
| 2013/0107584 A1 | 5/2013 | Li et al. |

FOREIGN PATENT DOCUMENTS

KR     2010-0010324 A     2/2010

OTHER PUBLICATIONS

International Patent Application No. PCT/US2015/023665—PCT International Search Report & Written Opinion, mailed Jul. 23, 2015, 10 pages.

*Primary Examiner* — Robert Deberadinis
(74) *Attorney, Agent, or Firm* — Blakely Sokoloff Taylor & Zafman LLP

(57) ABSTRACT

A Safe Operating Area (SOA) adaptive gate driver for a switch mode power converter is disclosed. In response to a detection of a fault condition, the SOA adaptive gate driver may limit the peak current in a power transistor (e.g., power MOSFET) of the power converter by limiting the voltage applied to the gate of the power MOSFET or by limiting the current injected into the gate of the power MOSFET. The limited gate voltage or current may increase the margin between an SOA border and the turn-off locus of the drain voltage and current ($V_D$ and $I_D$) to ensure safe operation of the switch mode power converter during the fault condition.

21 Claims, 10 Drawing Sheets

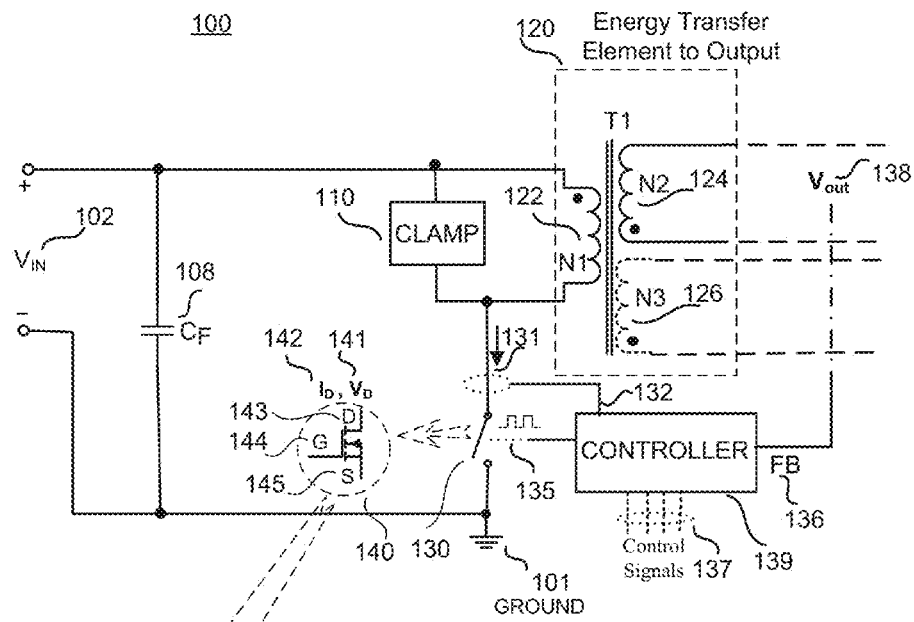
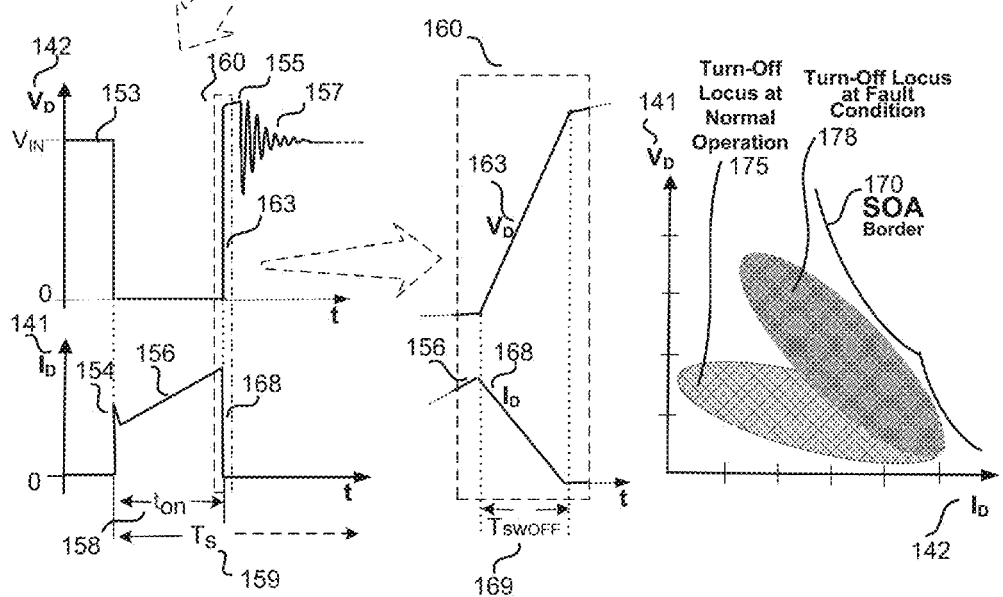
FIG. 1B   FIG. 1C   FIG. 1D

MOSFET DRIVER WITH PULSE TIMING PATTERN FAULT DETECTION AND ADAPTIVE SAFE OPERATING AREA MODE OF OPERATION

FIELD

The present disclosure relates generally to switch mode power supplies and, more specifically, to controllers with short circuit protection for switch mode power supplies.

RELATED ART

Conventional wall outlets generally deliver a high voltage alternating current (ac) power that needs to be transformed to direct current (dc) power before being used to power many electronic devices. Switch mode power converters are commonly used to convert the high voltage ac power to a regulated dc power due to their high efficiency, small size, low weight, and safety protection features. These converters include a power switch that may be turned on and off using various switch control techniques (such as Pulse Width Modulation (PWM), Pulse Frequency Modulation (PFM), Pulse skipping, and/or On-Off control) to regulate the output of the converter. The power transistor (e.g., a Power MOSFET) may have a predefined tolerance for on-state current and off-state voltage based on their structure design and size. A boundary (e.g., envelope) combination of Volt/Ampere (VI) tolerance of the switch defines a safe operating area (SOA) for the switch beyond which damage to the switch may occur. Thus, controllers for switching power supplies typically measure voltage and current for the purposes of protecting the switch and regulating an output.

However, limitations and characteristics of real devices may make it impractical (if not impossible) to protect the switch under all conditions. For example, the presence of parasitic inductance and capacitance in a Flyback converter may result in the simultaneous application of high voltage and current to the switch during switching events. In particular, an oscillatory voltage spike may be produced in a MOSFET power transistor during turn-off due to energy storage in the leakage inductance of the transformer. Additionally, the parasitic/stray capacitance may generate a considerable current spike during turn-on as the voltage of the transformer primary winding changes (e.g., from a positive input voltage $V_{in}$ to a negative reflected output voltage $-V_{or}$). To mask the turn-on current spike during normal operation, some converters may introduce a leading edge blanking time during which the measurement of the switch current is masked to avoid false indications of excess current. While the VI locus of the Power MOSFET can be effectively maintained within the SOA during normal operation, the use of the blanking time may hinder or prevent this under certain transient and fault conditions (e.g., at startup or during an output short circuit). As a result, the turn-on and the turn-off VI locus of the converter may exceed the SOA envelope of the Power MOSFET and cause a destructive breakdown of the device.

In the event that the output voltage drops low (e.g., during a partial or complete short circuit at the output, an overload condition, or start-up), traditional techniques that respond to excess current in the switch may be unable to prevent the current from exceeding desirable levels in a switching period. This is because the leading edge blanking time and current limit delay time impose a minimum on time of the switch, whereas the low output voltage causes the controller to demand a minimum off time of the switch.

To overcome problems associated with techniques in which the switch current is measured directly, U.S. Pat. No. 7,593,245 describes the measurement of switch on-time duration to detect a short on-time pulse. Such a short pulse (and corresponding short conduction time in the power switch) is taken as an indication of excess current in the switch. For instance, in one example, the conduction time of the switch may be measured rather than the current in the switch to recognize an uncontrollably increasing current. In response to detection of one or more short conduction times, a delay may be inserted into the next switching period, effectively extending the off time of the switch to allow the current to decrease to a safe value before the next on time of the switch. In response to detecting excess switch current during start-up or in the event of an overload condition, the frequency of the drive signal may be reduced.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 1A shows an example power converter according to various examples.

FIG. 1B shows example voltage and current waveforms illustrating the drain voltage and drain current of a power switch.

FIG. 1C shows a zoomed-in view of the example voltage and current waveforms of FIG. 1B.

FIG. 1D is an example VI graph illustrating a turn-off locus and SOA border during normal operation and in the event of a fault condition.

DETAILED DESCRIPTION

Figure 2A:
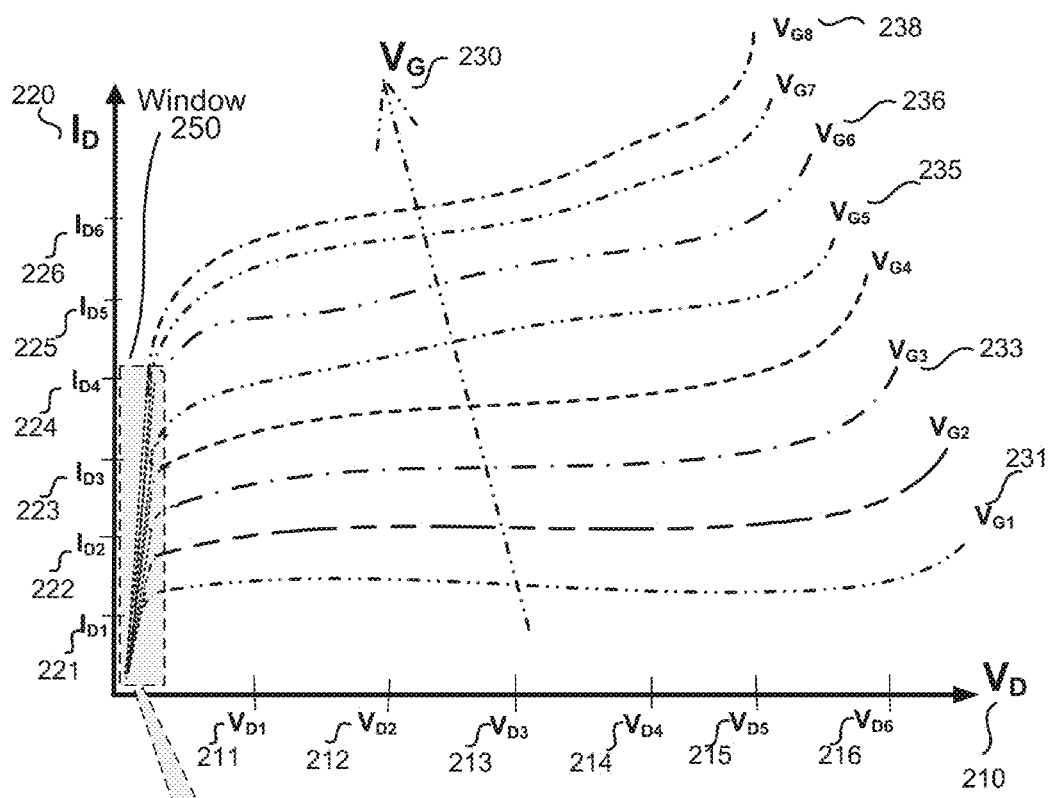
FIG. 2A is an example graph illustrating drain voltage-current characteristics at different gate voltages.

In the following description, numerous specific details are set forth in order to provide a thorough understanding. It will be apparent, however, to one having ordinary skill in the art that the specific details need not be employed.

Various examples directed to an adaptive gate driver that is designed to maintain a switch mode power converter in a SOA are disclosed. In response to a detection of a fault condition, the SOA adaptive gate driver may limit the peak current in a Power MOSFET of the power converter by limiting the voltage applied to the gate of the power switch or by limiting the current injected into the gate of the power switch. The limited gate voltage or current may increase the margin between an SOA border and the turn-off locus of the drain voltage and current ($V_D/I_D$) to ensure safe operation of the power converter during the fault condition. This may allow for the use of a MOSFET power transistor having a reduced breakdown voltage rating and an increased saturation current with a full gate voltage. Additionally, this may allow for the optimization of the Power MOSFET design and reduction of the specific $R_{dson}$, thereby reducing the Power MOSFET area and cost.

FIG. 1A shows an example flyback converter 100 coupled to receive input voltage $V_{IN}$ 102 across a filter capacitor $C_F$ 108. Converter 100 generally includes switching element 130 (coupled to ground 101), controller 139, and energy transfer element T1, 120 having a primary winding 122 (N1 turns) and one or more secondary and auxiliary windings 124 (N2 turns) and 126 (N3 turns) wound on the same core. Converter 100 may further include clamp circuit 110 coupled across primary winding 122 to absorb high voltage stress that may occur on switching element 130 during turn-off due to leakage inductance energy of the energy transfer element T1, 120.

Switching element 130 may be controlled by controller 139 using switching pulses 135 or other drive signal in response to feedback signal FB 136. The switching pulses 135 or other drive signal are generated based on the output voltage $V_{out}$ 138, a switch current sense signal 132 representative of switch current 131, and/or one or more other control signals 137. The controlled switching of switching element 130 causes energy to be transferred from the input of converter 100 to provide a regulated output voltage $V_{out}$ 138. Further shown in FIG. 1A is an example Power MOSFET 140 that may be used as switching element 130. Power MOSFET 140 may include drain terminal 143, source terminal 145, and gate terminal 144. A drain voltage $V_D$ 142 and drain current $I_D$ 141 of Power MOSFET 140 are also shown.

FIG. 1B shows example voltage and current waveforms of drain voltage $V_D$ 142 and drain current $I_D$ 141 during a switching cycle $T_S$ 159 during normal operation. As shown, when Power MOSFET 140 turns on (at the start of switch on-time $t_{on}$ 158), drain voltage $V_D$ 142 drops sharply from voltage $V_{IN}$ 153 to approximately zero and drain current $I_D$ 141 sharply rises from approximately zero to level 154 that, in a real world device that includes, e.g., switch and transformer parasitics, may overshoot level 154 (turn-on spike).

During switch on-time $t_{on}$ 158, drain voltage $V_D$ 142 remains substantially at zero and drain current $I_D$ 141 rises generally linearly over time with a slope 156 in response to the load and input voltage. When Power MOSFET 140 turns off, drain current $I_D$ 141 drops sharply at edge 168 and drain voltage $V_D$ 142 rises sharply at edge 163 during a narrow time window 160. The relatively rapid rise of drain voltage $V_D$ 142 at turn off may result in a dramatic overshoot and oscillations 157 due to the release of leakage energy from energy transfer element T1, 120. The dramatic overshoot is mainly absorbed by clamp circuit 110 to clamp the first oscillation peak to a level 155.

FIG. 1C shows a zoomed-in view of the voltage and current waveforms of drain voltage $V_D$ 142 and drain current $I_D$ 141 during time window 160. As shown, during switch turn-off time $T_{SWOFF}$ 169, the simultaneous presence of the relatively sharp rise at edge 163 of drain voltage $V_D$ 142 and the relatively sharp decrease at edge 168 of drain current $I_D$ 141 may cause turn-off stress on the Power MOSFET.

FIG. 1D illustrates the turn-off locus of drain voltage $V_D$ 142 and drain current $I_D$ 141 in comparison to an SOA border 170 for an example Power MOSFET under different conditions. The graph area 175 represents the turn-off locus at low line voltages (e.g., 120 Vac) during normal operation. As shown, there is sufficient margin between area 175 and SOA border 170. It should be appreciated that at high line voltages, there may be a higher turn-off stress on the Power MOSFET and the turn-off locus may shift higher towards SOA border 170. Area 178 represents the turn-off locus during a fault condition (e.g., a short circuit). As shown, turn-off locus area 178 may shift to be closer to SOA border 170 due to the extreme voltage and current stresses applied to switching element 130, 140.

FIG. 2A is an example graph illustrating the full scale Power MOSFET VI characteristics at different gate voltages. In particular, FIG. 2A shows various drain on-state currents $I_D$ 220 (i.e., $I_{D1}$ 221 to $I_{D6}$ 226) as a function of drain off-state voltage $V_D$ 210 (i.e., $V_{D1}$ 211 to $V_{D6}$ 216) for various gate voltages. The gate voltages increase in the direction of arrow $V_G$ 230 from $V_{G1}$ 231 to $V_{G8}$ 238. At full gate drive voltage $V_G$ 230 (e.g., $V_G \geq 6$ V), the saturation current of the Power MOSFET is significantly higher than the typical current limit at which this device is used. Depending on the application, the current limit range may vary. In one example, the current limit may be from 2 to 5 A.

Figure 2B:
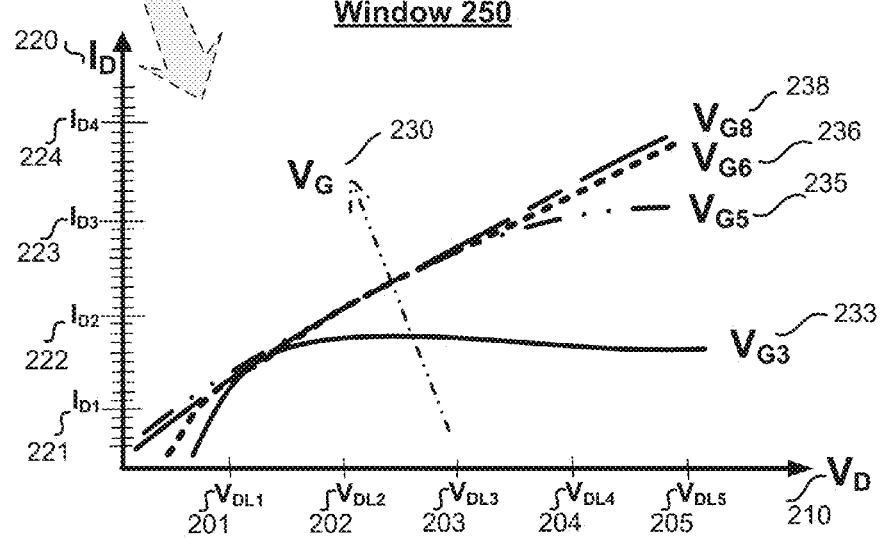
FIG. 2B is an example graph illustrating a zoomed-in view of the drain voltage-current characteristics at low drain voltages.

FIG. 2B is a zoomed-in view of window 250 of FIG. 2A. Window 250 represents the portion of the graph of FIG. 2A corresponding to low values of drain current $I_D$ 220 (e.g., below 6 A) and low values of drain off-state voltage $V_D$ 210 (e.g., below 10V) for selected gate voltages $V_{G3}$ 233, $V_{G5}$ 235, $V_{G6}$ 236, and $V_{G8}$ 238.

As mentioned above and observed in FIGS. 2A and 2B, one option for limiting the VI locus of a power MOSFET in a fault condition is by lowering the gate voltage to limit the drain current at the expense of having a higher drain voltage and thus, higher power dissipation in the power MOSFET. In some examples, a full gate drive voltage may be applied to the power MOSFET during normal operation to minimize the on-state losses. However, during a fault condition, an SOA mode of operation may be initiated in which the gate drive voltage may be limited to a lower voltage. Thus, the controller may operate at high efficiency (full gate drive voltage) during normal operation and limit the peak current of the power MOSFET during a fault condition by limiting the gate drive voltage. In one example, for 2.5 A current limit, a 3.5V to 4V gate drive may be sufficient under fault condition, but a 6V gate drive may be preferred during normal operation to minimize the on-state loss. There are multiple ways of implementing this in a controller, such as having one or more stages of Darlington pairs with NPNs (as described below with reference to FIGS. 5A and 6A).

Another option for limiting the VI locus of a power MOSFET in a fault condition is to control the gate charge by controlled current supplies. For example, during normal operation, the gate capacitance of a power MOSFET may be charged at a full rate for a faster turn-on. However, during a fault condition indicated by a high drain current, an SOA mode of operation may be initiated in which the gate charging rate may be reduced. For example, current supplies may be selected so that the charge loaded onto the gate capacitance (e.g., gate-to-source and gate-to-drain, Miller capacitance) is reduced. Thus, the turn-on of the power MOSFET may be delayed, as depicted in FIG. 4D.

Figure 3A:
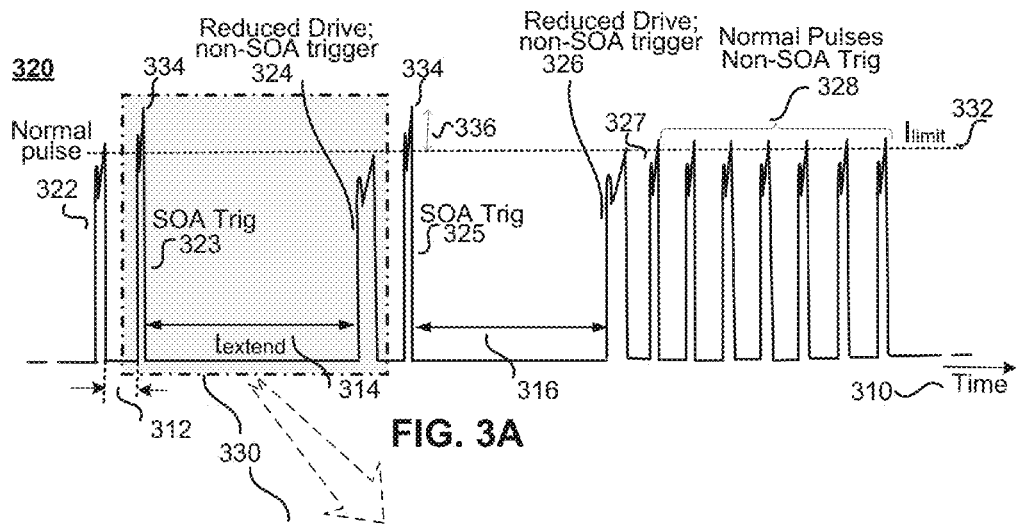
FIG. 3A shows an example pulse timing pattern to detect a fault condition and to activate an SOA mode of operation in a power converter.

FIG. 3A illustrates a graph 320 showing an example pulse timing pattern of drain current pulses versus time axis 310. Drain current pulses are shown in a normal mode of operation (e.g., normal pulse 322 at no fault). After time period 312, a short circuit fault represented by a narrow high-amplitude drain current pulse 323 may occur, triggering an SOA mode of operation. During an SOA mode of operation in time window 330, the SOA trigger pulse 323 may be followed, after an extended off time $t_{extend}$ 314, by a drain current pulse 324 having a reduced drive current. The reduced drive current can limit drain current pulse 324 to a non-SOA triggering current level (i.e., below SOA triggering level 334). SOA triggering level 334 itself exceeds current limit level $I_{limit}$ 332 by amount 336 due to, e.g., the delays inherent in real-world devices. If a fault condition still exists in the next switching cycle after drain current pulse 324 (e.g., drain current pulse 325 reaches SOA triggering level 334), then the SOA mode of operation may remain activated and the operation described above during SOA mode of operation time window 330 may repeat. If, however, after delay time period 316, a drain current pulse 326 with reduced drive current is followed by pulses that remain below SOA triggering current level 334, the SOA mode of operation may be deactivated. In the example of FIG. 3A, after drain current pulse 326, a drain current pulse 327 having a value below SOA triggering level 334 may be taken as indicating that there is not a fault condition (e.g., the fault has cleared). As such, drain current pulse 327 may be followed by normal drain current pulse train 328, which includes non-SOA trigger pulses that do not exceed the SOA triggering level 334.

Figure 3B:
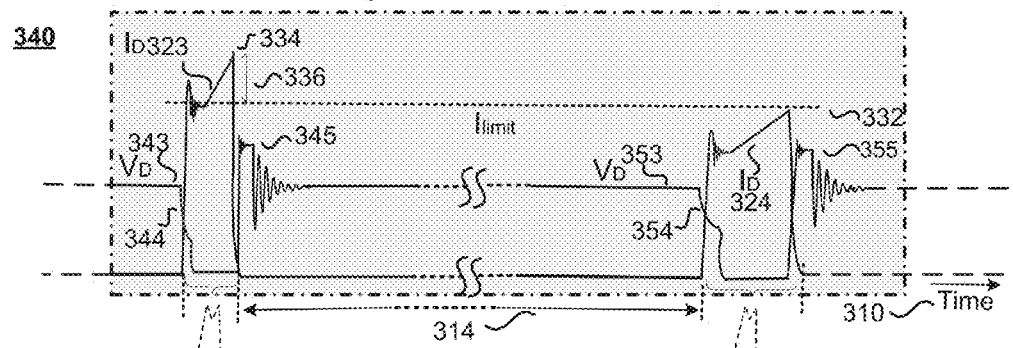
FIG. 3B shows a zoomed-in view of the example pulse timing pattern of FIG. 3A.

Graph 340 in FIG. 3B is a zoomed-in view of time window 330 of FIG. 3A showing drain current and voltage pulses that may be generated during the SOA mode of operation. The drain current and voltage pulses ($I_D$ 323 and $V_D$ 343) for the SOA trigger pulse 323 and the drain current and voltage pulses with reduced drive current ($I_D$ 324 and $V_D$ 353) in the SOA mode of operation are shown in detail together in a broken time scale for the delay time interval 314. When the narrow high-amplitude drain current pulse $I_D$ 323 occurs due to a fault condition, the peak of the current pulse exceeds the current limit level $I_{limit}$ 332 and reaches the SOA triggering level 334. When the power MOSFET gate-source control signal rises, the drain current starts to rise. During the charging of the gate-drain capacitance (i.e., the Miller capacitance), the drain-source capacitance $C_{DS}$ discharges and the drain voltage $V_D$ 343 drops as the current through the power MOSFET increases. This charging of Miller capacitance is represented by the plateaus 423, 433 in gate voltage shown in FIG. 4A. It should be appreciated that the slope of the drain voltage drop depends on (e.g., is generally proportional to) the Miller plateau level and gate charging supply. The gate charging supply may be controlled by the gate driver voltage or current level. In FIG. 3B, some distortion may also be observed in the drain voltage drop due to the parasitic and other real-world effects on the charging of the Power MOSFET capacitance.

The drain voltage $V_D$ 343 during the fault condition with normal strength gate driver signal shows a fast drop (relatively high dv/dt slope) 344. However, for a subsequent SOA mode of operation in which the drain pulse is controlled using a reduced drive signal that occurs after the delay time 314, the drain voltage $V_D$ 353 drops with some delay and with a reduced slope (lower average dv/dt of voltage drop 354 than the average dv/dt of voltage drop 344). After the Power MOSFET turn off, some oscillations (345 or 355) may occur, e.g., due to resonance between the transformer leakage inductance and parasitic capacitance of the transformer and Power MOSFET. In the example shown in graph 340, the first oscillation may be clamped by a clamping circuit across the transformer primary winding.

Figure 3C:
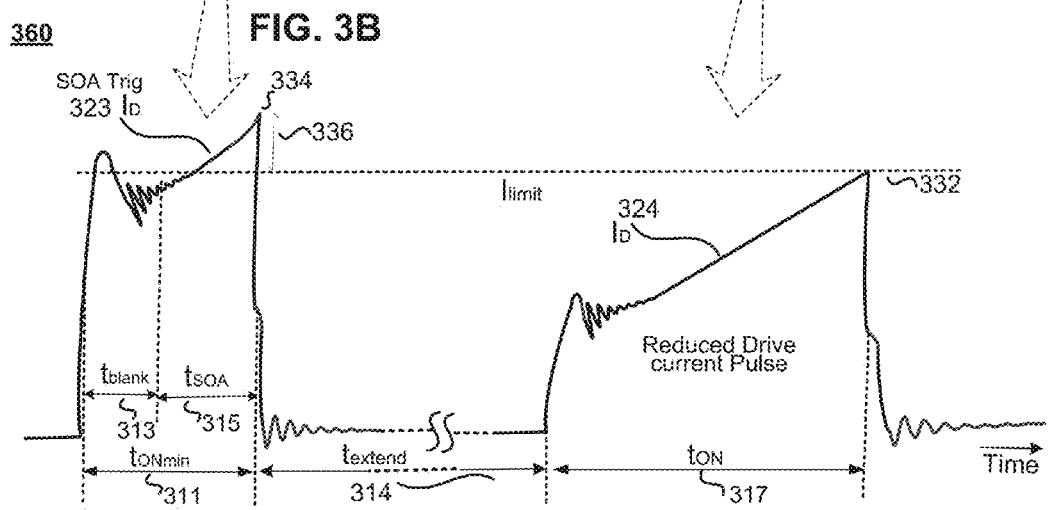
FIG. 3C shows a zoomed-in view of the example pulse timing pattern of FIG. 3B.

FIG. 3C is a graph 360 illustrating a further zoomed-in view of the drain current pulses in the SOA mode of operation during time window 330 of FIGS. 3A and 3B. The drain current pulse $I_D$ 323 may result from a fault condition with a normal strength gate signal. A short duration and high-amplitude drain current that reaches the SOA triggering level 334 results. This triggers activation of (and transition into) the SOA mode of operation. The minimum on-time period $t_{ONmin}$ 311 includes a blanking time interval $t_{blank}$ 313 plus an SOA detection time interval $t_{SOA}$ 315. Upon activation of the SOA mode of operation, an extended off time $t_{extend}$ 314 may be inserted before application of the reduced strength gate signal. As a result, the next drain current pulse 324 has a on-time $t_{on}$ 317 that is determined by the drain current reaching current limit level $I_{limit}$ 332.

As mentioned above, at a fault condition with a normal strength gate signal, the transition to the SOA adaptive mode of operation may occur during SOA window right after turn on blanking window. In the SOA adaptive mode of operation, power delivery is limited to the safe operating area SOA by controlling and limiting either the gate voltage or the charge injection (current) provided by the driver to the gate terminal of power switch.

Figure 4A:
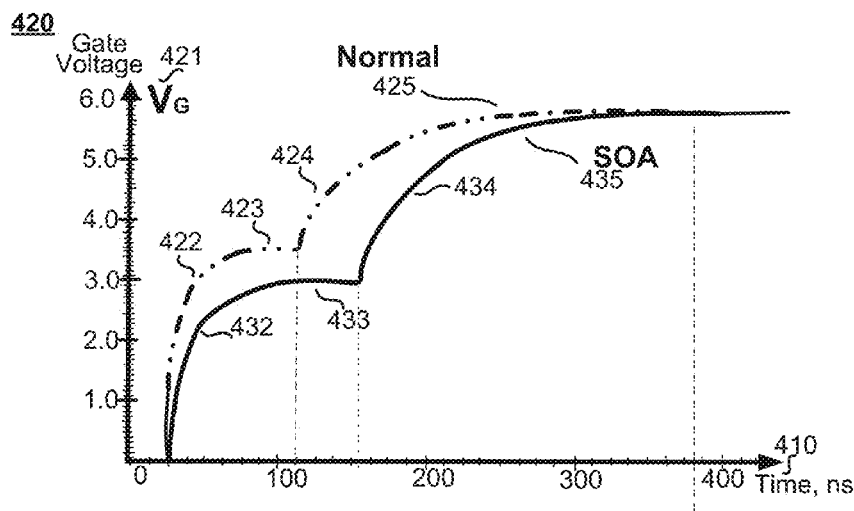
FIG. 4A shows example gate voltage rise-up characteristics of a switch at turn-on during normal operation and in the SOA mode of operation.

FIG. 4A shows a graph 420 illustrating the power MOSFET gate drive voltage versus time at turn-on during a normal mode of operation (i.e., with normal strength gate drive signal) and during an SOA adaptive mode of operation in the event of a fault condition (i.e., with a reduced strength gate drive signal). One example of such a fault condition is an output short circuit. The fault condition may generate a high-amplitude drain current pulse of a relatively short duration (e.g., in the range of few hundred nanoseconds) that, without the introduction of the SOA adaptive mode of operation, could cause destructive stress on the power transistor. Graph 420 shows gate voltage $V_G$ 421 rising from 0 to 6V for an example power MOSFET. Line 425 represents the gate voltage rise during a normal mode of operation with full gate charging current. Line 435 represents the gate voltage rise in the SOA adaptive mode of operation with reduced gate charging current. In the SOA adaptive mode of operation, the initial slope of the gate voltage (gate-source capacitor charging) is reduced (i.e., 422 is reduced to 432) and the Miller plateau threshold is delayed (i.e., 423 is delayed to 433). The delayed turn-on of the power switch (i.e., 424 versus 434) results in a lowered and delayed gate voltage during the first few hundred nano seconds (e.g., 250 ns) of the drain current rise. Consequently, the lowered and delayed gate voltage limits the power delivery of the power MOSFET.

Figure 4B:
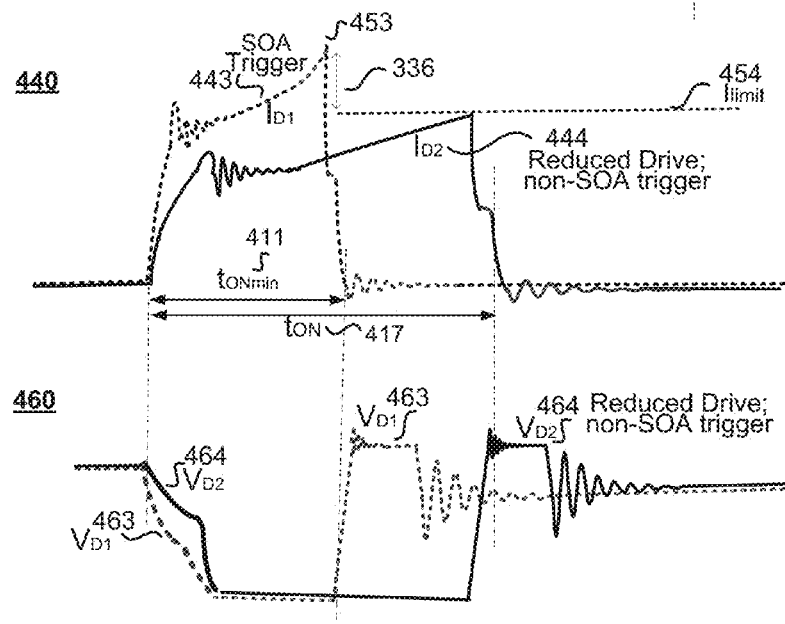
FIG. 4B shows example drain current pulse waveforms for a first drain current pulse that triggers activation of the SOA mode of operation and a second reduced drive current pulse generated in the SOA mode of operation.

Graph 440 in FIG. 4B shows a comparison of power MOSFET drain current pulses at turn-on and during a conduction period for an SOA trigger pulse (i.e., 323 in FIG. 3A) and for an SOA adaptive mode of operation with a reduced drive signal (i.e., 324 in FIG. 3A) in the event of a fault condition. The higher amplitude SOA trigger pulse $I_D$ 443 may exceed $I_{limit}$ 454 during the SOA window, resulting in the activation of the SOA mode of operation. In contrast, drain current pulse 444 can be generated using a reduced strength gate drive signal after an extended time $t_{extend}$. For the sake of comparison, drain current pulse 444 is depicted on top of SOA trigger pulse $I_D$ 443. However, drain current pulse 444 will occur after SOA trigger pulse $I_D$ 443 in real devices. In particular, when drain current pulse 443 exceeds the $I_{limit}$ 454 during an SOA window before the end of a minimum on-time $t_{ONmin}$ 411, the subsequent pulse will be drain current pulse 444 in the SOA mode of operation. This drain current pulse 444 is limited by the normal current limit level $I_{limit}$ 454 and may deliver a non-destructive level of energy at turn off to keep the power MOSFET in its safe operating area.

Figure 4C:
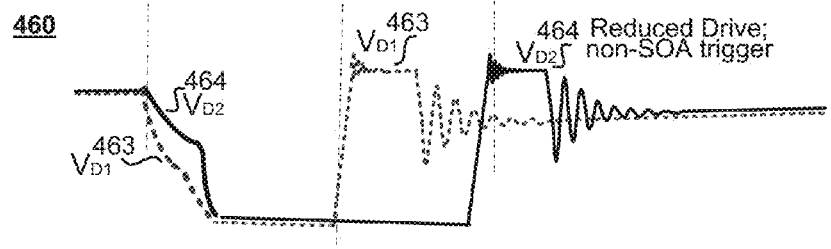
FIG. 4C shows example drain voltage pulse waveforms associated with the drain current pulses of FIG. 4B.
Figure 4D:
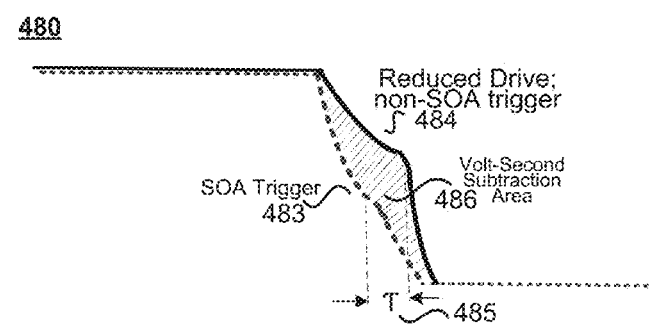
FIG. 4D shows a zoomed-in view of the example drain voltage pulse waveforms of FIG. 4C.

Graph 460 in FIG. 4C shows the drain voltage pulses associated with the drain current pulses of FIG. 4B using the same time scale (at turn-on and during a conduction period). Once again, they are overlapped for the sake of comparison only. Due to a normal strength gate drive signal, the rising edge of SOA trigger pulse $I_D$ 443 (in FIG. 4B) has more positive slope than the slope of drain current $I_D$ 444 (in FIG. 4B). Likewise, the falling edge of drain voltage pulse $V_{D1}$ 463 (in FIG. 4C) has a more negative slope than the slope of drain voltage pulse $V_{D2}$ 464 (in FIG. 4C).

The drain current pulse 444 and the drain voltage pulse $V_{D2}$ 464 in the SOA mode of operation are generated by a limited current or voltage drive signal (e.g., limited gate charge). The drive signal can be chosen such that the peak current reaches the safe current limit level 454 with a normal on-time. The average slope of drain voltage drop at the power MOSFET is also less negative and delayed, as explained further in reference to FIG. 4D.

FIG. 4D shows a graph 480 having a zoomed-in scale to illustrate the volt-second difference between a) a turn-on drain voltage falling edge 483 when a SOA detect/trigger drain current pulse 443 is present and b) a drain voltage falling edge 484 that is generated using a reduced strength gate drive signal. As discussed above with reference to FIG. 3B, the drain voltage drop at the power MOSFET turn-on may include some distortion due to the parasitic and uneven charging of the power MOSFET capacitance in real-world devices.

As shown in FIG. 4D, the average slope of drain voltage falling edge 484 is less negative and delayed (a maximum delay time τ 485) relative to drain voltage falling edge slope 483 that is generated using with a normal strength gate drive signal. The hashed volt-second difference (i.e., area 486) between the drain voltage falling edges 483 and 484 may result in a reduced turn-on switching stress and a lower switching loss.

Figure 5A:
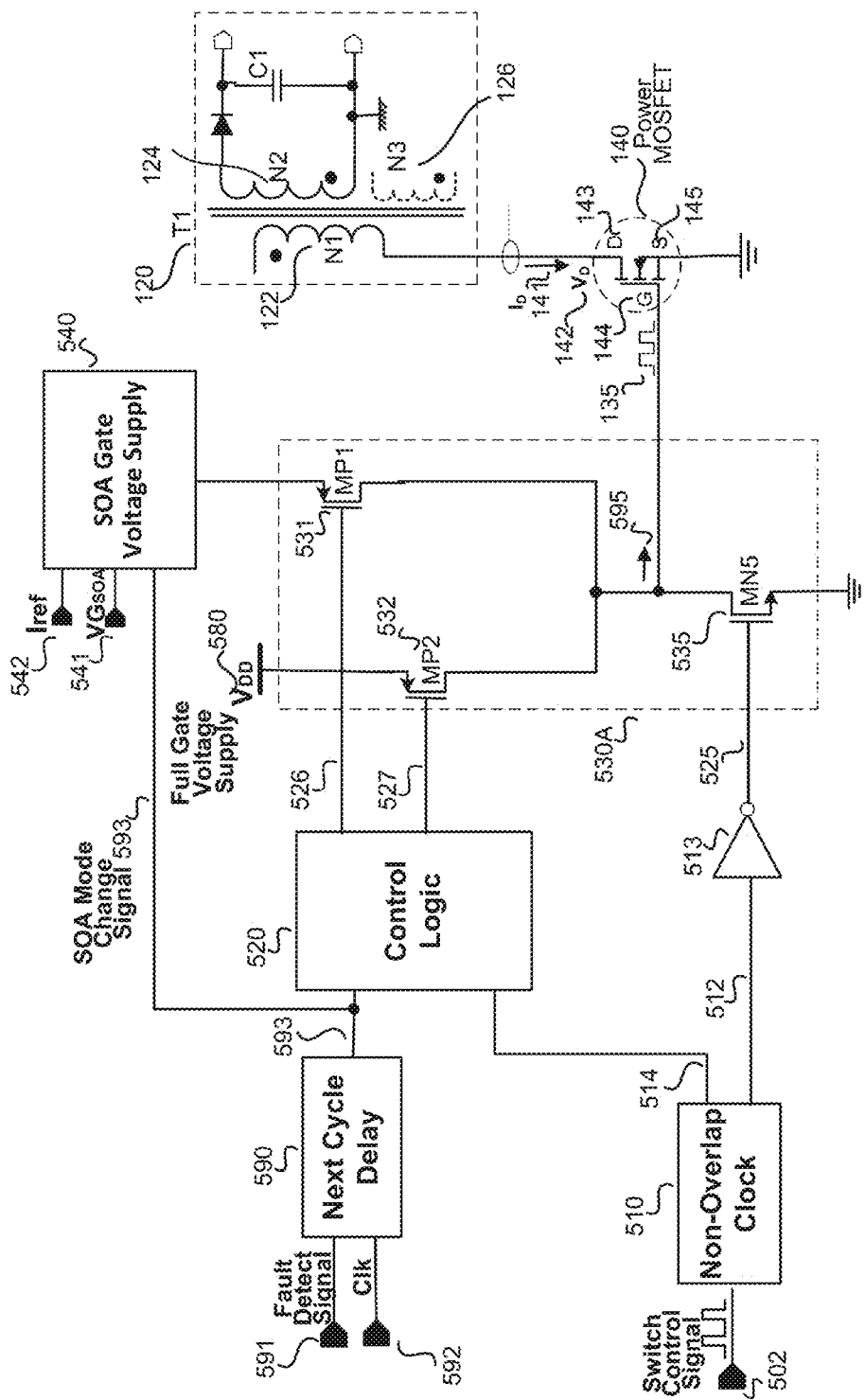
FIG. 5A shows a simplified circuit block diagram of an example SOA adaptive gate driver that implements gate driver voltage control.
Figure 5B:
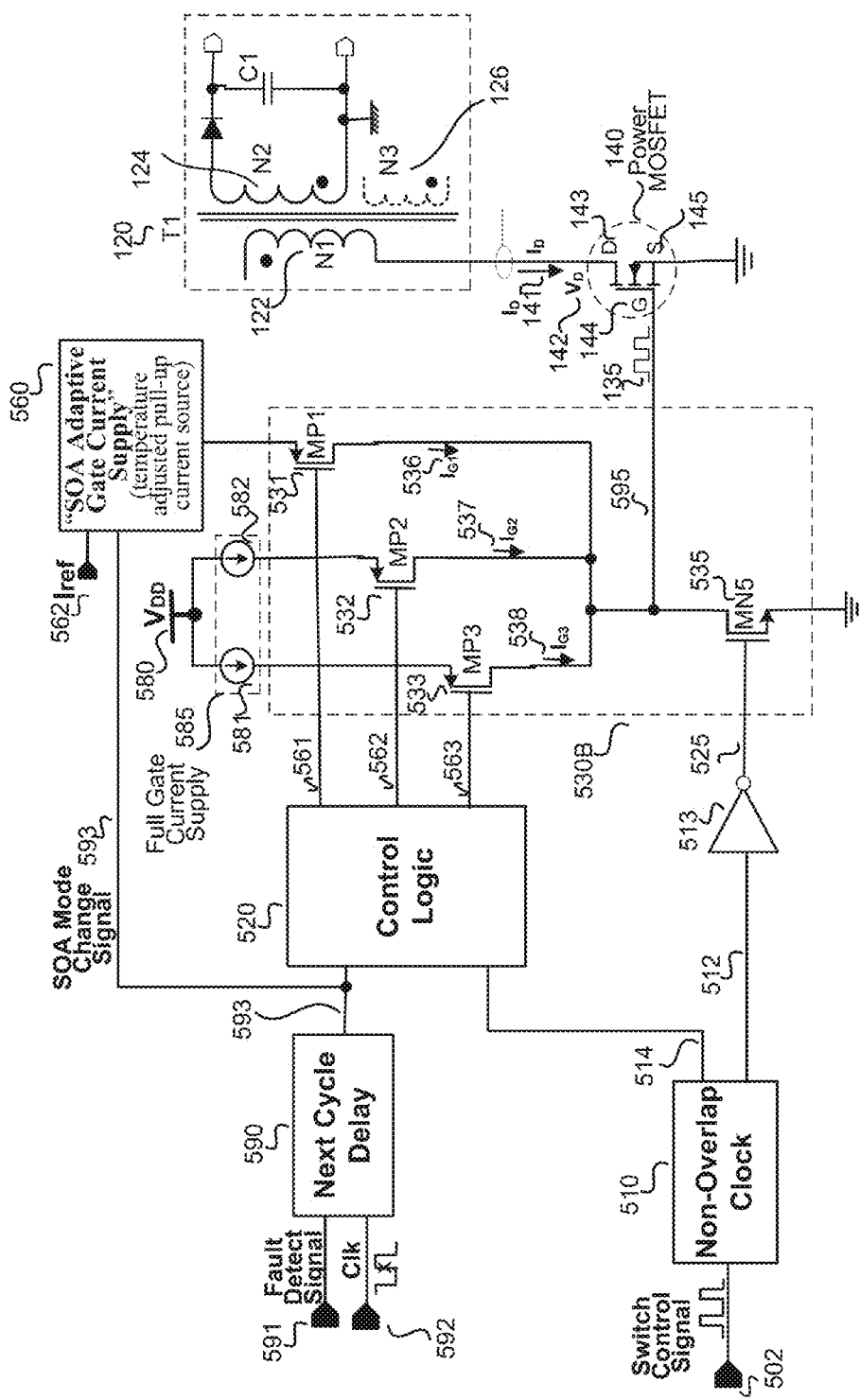
FIG. 5B shows another simplified circuit block diagram of an example SOA adaptive gate driver that implements gate driver current control.

The block diagrams of FIGS. 5A and 5B show simplified internal block diagrams of example SOA adaptive gate drivers that may be used to implement the two types of SOA mode of operation control (e.g., through either gate driver voltage control (FIG. 5A) or gate driver current control (FIG. 5B)). The common blocks and common signals in FIGS. 5A and 5B have the same labels, while parts that differ between the two (e.g., gate driver voltage control or gate driver current control) are introduced with different labels.

FIG. 5A shows a simplified circuit block diagram of an example SOA adaptive gate driver that maybe be used in a controller (e.g., controller 139) to implement gate driver voltage control by limiting the gate voltage during the SOA mode of operation. The SOA adaptive gate driver may include driver circuit 530A coupled to generate an output signal 595 that may vary between a ground or other reference voltage and a voltage (e.g., >6V) that drives a power MOSFET in saturation or between ground (or other reference) and the SOA mode reduced gate voltage level (e.g., 2.5-4V). In either case, the power MOSFET 140 of the power converter is switched between an on state and an off state. Driver circuit 530A may include low side driver switch MN5 535 and high side switches MP1 531 and MP2 532. High side switches MP1 531 and MP2 532 may be selectively turned on and off to set the upper voltage of output signal 595 during the normal mode of operation and the SOA mode of operation, while low side switch MN5 535 may be selectively turned on and off to transition output signal 595 between ground (or other reference) and the upper voltage set by the high side switches MP1 531 and MP2 532.

The SOA adaptive gate driver may further include a non-overlapping clock 510 coupled to receive switch control signal 502 and to output two gating signals 512 and 514 that may be delayed relative to each other. Signal 512 may be inverted by an inverter 513, and the inverted output 525 may be coupled to control the low side driver switch 535.

The SOA adaptive gate driver may further include a next cycle delay (latch) block 590 that is coupled to receive a fault detect signal 591 and clock signal 592. Next cycle delay (latch) block 590 is coupled to output SOA mode change signal 593. SOA mode change signal 593 triggers transition from a normal mode of operation to an SOA mode of operation in response to a fault condition (and vice-versa when the fault condition is removed signal 593 changes state again and allows transition back to the normal mode of operation). The SOA mode change signal 593 may be generated by next cycle delay block 590 in response to state change of fault detect signal 591.

The SOA adaptive gate driver may further include control logic 520 coupled to receive gating signal 514 and SOA mode change signal 593 to output one or both of gating signals 526, 527 in response to SOA mode change signal 593. Gating signals 526 and 527 are coupled to control upper driving switches MP1 531 and MP2 532. Upper driving switch MP2 532 couples the full gate voltage supply VDD 580 to the control terminal (gate) of the power MOSFET. Upper driving switch MP1 531 couples the SOA gate voltage supply 540 to the control terminal (gate) of the power MOSFET. In one example, fault detect signal 591 during a normal mode of operation (no fault) may remain at a logic high, causing next cycle delay block 590 to output SOA mode change signal 593 at a logic high. In response, control logic 520 may activate gating signal 527 (logic low to turn on PMOS switch MP2 532) and deactivate gating signal 526 (logic high to turn off PMOS switch MP1 531). As a result, switch MP2 532 in driver circuit 530A turns on (whereas switch MP1 531 does not turn on) and a gate voltage level (in one example >6V) is applied from the gate voltage supply 580 (e.g., $V_{DD}$) as the output signal 595 of driver circuit 530A.

In response to detecting a narrow high-amplitude drain current pulse (e.g., drain current pulse 323 in FIG. 3A) that is indicative of a fault condition, fault detect signal 591 may change state (e.g., from a logic high to a logic low). Consequently, the SOA mode change signal 593 output by next cycle delay block 590 may also change state (e.g., from logic high to logic low) at the next rising edge of the clock signal 592, resulting in control logic 520 activating gating signal 526 (logic low to turn on PMOS switch MP1 531) and deactivating gating signal 527 (logic high to turn off PMOS switch MP2 532). Thus, switch MP1 531 in driver circuit 530A turns on (whereas switch MP2 532 does not turns on) and an SOA mode reduced gate voltage level (e.g., 2.5-4V) from SOA gate voltage supply 540 is applied as the output signal 595 of driver circuit 530A. In one example, SOA gate voltage supply 540 may generate the reduced SOA gate voltage level based on signal $I_{ref}$ 542, a reduced gate supply for SOA mode $VG_{SOA}$ 541, and a state change in SOA mode signal 593 received at its input terminals.

FIG. 5B shows a simplified circuit block diagram of an example SOA adaptive gate driver that may be used to implement gate driver current control by limiting the gate current during the SOA mode of operation. The SOA adaptive gate driver may include driver circuit 530B coupled to generate an output signal 595 that may vary between ground (or other reference) and the voltage (e.g., >6V) of gate voltage supply 580 to switch the power MOSFET 140 of the power converter between an on state and an off state, as discussed above with respect to FIG. 1A. Additionally, output signal 595 may have a variable drive current (equal to a combination of current $I_{G3}$ 538 and either current $I_{G1}$ 536 or current $I_{G2}$ 537 from current supply 581, SOA gate current supply 560, and current supply 582, respectively) based on the mode of operation of the SOA adaptive gate driver (e.g., normal operation or SOA mode of operation). Driver circuit 530B includes low side driver switch MN5 535 and high side switches MP1 531, MP2 532, and MP3 533. High side switches MP1 531, MP2 532, and MP3 533 may be selectively turned on and off to set the drive current of output signal 595, whereas low side switch MN5 535 may be selectively turned on and off to transition output signal 595 between ground (or other reference) and the gate high side supply. In one example, current supply 581 through switch MP3 533 provides current $I_{G3}$ 538 (e.g., 33 mA) to the gate 144 of the power MOSFET 140. Current supply 582 through switch MP2 532 may add an additional gate current $I_{G2}$ 537 (e.g., 40 mA) to the gate current $I_{G3}$ 538 to provide a total of $(I_{G2}+I_{G3})$ full gate current. SOA adaptive gate current supply 560 (e.g., a temperature compensated pull-up current supply) and current $I_{G1}$ 536 through switch MP1 531 may have a lower current value (e.g., 11 mA) to provide a reduced value of the total gate current $(I_{G1}+I_{G3})$.

Similar to the SOA adaptive gate driver of FIG. 5A, the SOA adaptive gate driver of FIG. 5B may include control logic 520 coupled to receive gating signal 514 and SOA mode change signal 593. Control logic 520 may further be coupled to output two or more gating signals (e.g., gating signals 561, 562, and 563) to control the high side switches of driver circuit 530B.

The SOA adaptive gate driver may be configured to operate in a normal mode of operation in the absence of a detected fault condition. However, in response to detection of a high amplitude drain current caused by a fault condition during an SOA time window (707 in FIGS. 7A and 7B) that occurs after the drain blanking time window (706 in FIGS. 7A and 7B), the SOA adaptive gate driver may transition to operate in the SOA mode of operation. In one example, the duration of blanking time window and SOA time window may each be in the range of few hundreds nanoseconds.

In the normal mode of operation (no fault), control logic 520 may be configured to activate gating signals 562 and 563 (logic low to turn on PMOS switches MP2 532 and MP3 533) and to deactivate gating signal 561 (logic high to turn off PMOS switch MP1 531). As a result, current supply 582 may inject the higher current $I_{G2}$ 537 (e.g., 40 mA) through switch MP2 532 and current supply 581 may inject current $I_{G3}$ 538 (e.g., 33 mA) through switch MP3 533, causing a total current $(I_{G3}+I_{G2}=73$ mA) from full gate current supply 585 (represented by current supplies 581 and 582) to be injected into gate 144 of power MOSFET 140.

While in the SOA mode of operation, control logic 520 may be configured to activate gating signals 561 and 563 (logic low to turn on PMOS switches MP1 531 and MP3 533) and to deactivate gating signal 562 (logic high to turn off PMOS switch MP2 532). As a result, the SOA adaptive gate current supply 560 (e.g., a temperature compensated pull-up current supply) may inject a smaller current $I_{G1}$ 536 (e.g., 11 mA) through switch MP1 531 and current supply 581 may inject current $I_{G3}$ 538 (e.g., 33 mA) through switch MP3 533. This results in a lower total current $(I_{G3}+I_{G1}=44$ mA) being injected into gate 144 of power MOSFET 140 and causes a lower slew rate and delayed turn on of the power MOSFET 140, as depicted in FIGS. 4A-4D. SOA gate current supply 560 may be designed to be temperature compensated to compensate for any current changes due to temperature rise during a fault condition. SOA gate current supply 560 generates a regulated current supply with reduced level by receiving signal $I_{ref}$ 562 and a state change in SOA mode change signal 593 at its input terminals.

The switching pulses 135 applied to the gate terminal 144 of power MOSFET 140 may be generated by alternating switching of the low side switch MN5 535 to pull down the gate terminal 144 to ground. The gating signal 525 of the low side switch MN5 535 through the inverter buffer 513 is a complementary signal relative to the gating signals of the high side switches. A non-overlapping clock 510 may provide sufficient dead gap between the complementary switching of the low side switch MN5 535 and the high side switches (MP1 531, MP2 532 and MP3 533) to avoid shoot through.

Figure 6A:
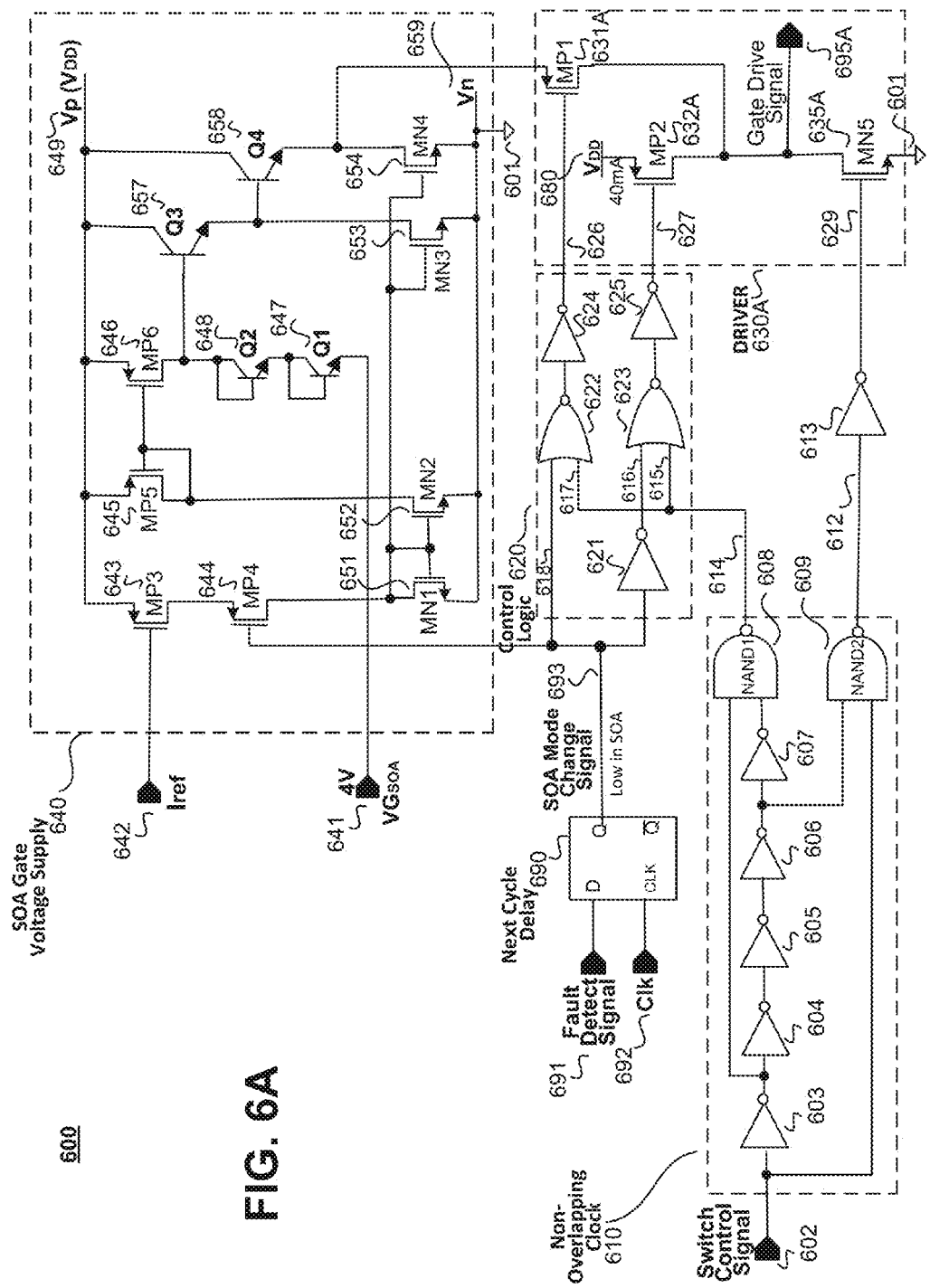
FIG. 6A shows a detailed circuit diagram of an example implementation of the SOA adaptive gate driver of FIG. 5A.
Figure 6B:
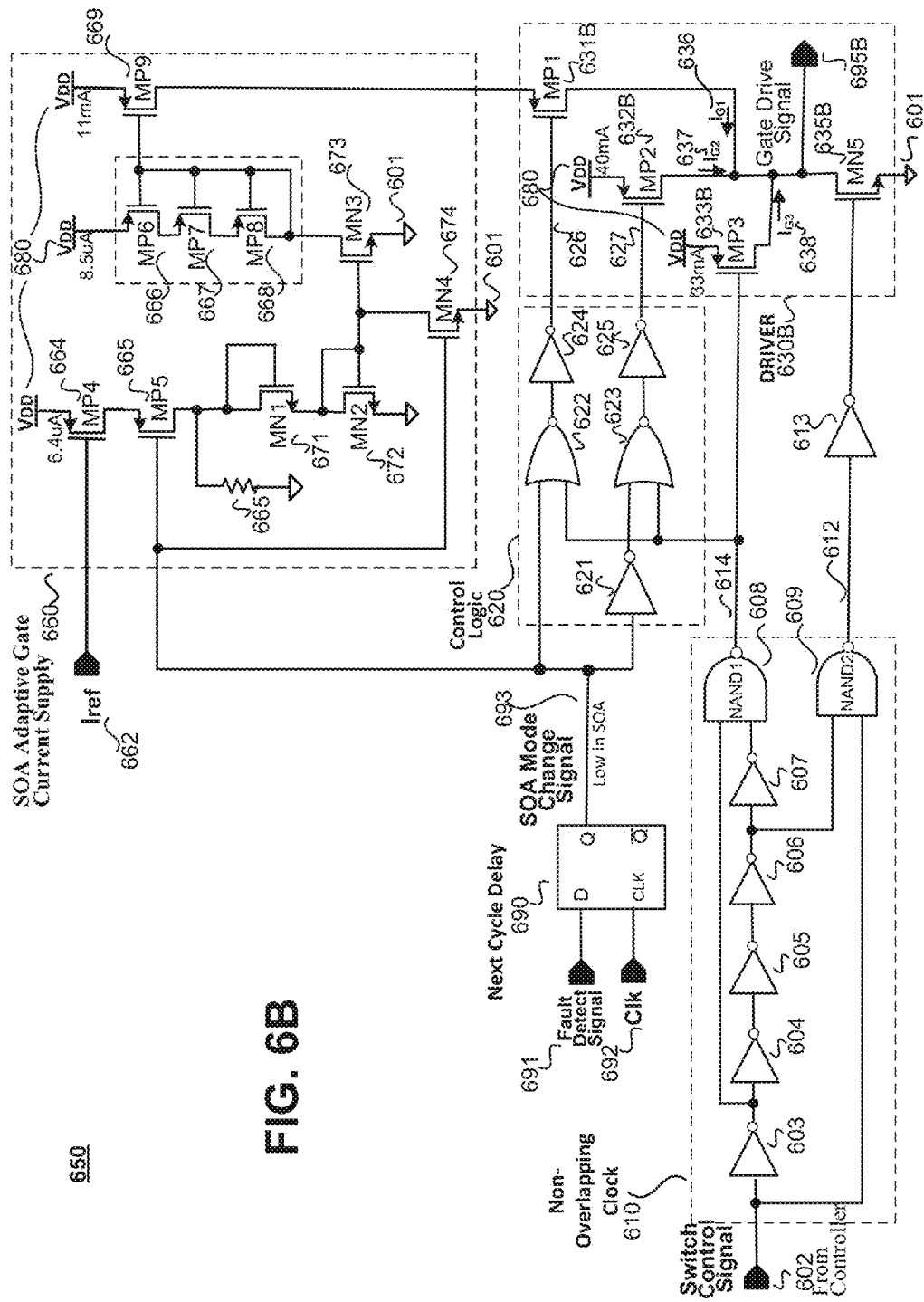
FIG. 6B shows a detailed circuit diagram of an example implementation of the SOA adaptive gate driver of FIG. 5B.

FIGS. 6A and 6B show more detailed logic circuit block implementations that may be used in the SOA adaptive gate drivers of FIGS. 5A and 5B, respectively. As shown in FIG. 6A, SOA adaptive gate driver 600 may include a non-overlapping clock 610 (which may be used to implement non-overlapping clock 510, FIGS. 5A and 5B) coupled to receive switch control signal 602 from the control output. Non-overlapping clock 610 may generate a gating signal 612 that is delayed relative to a gating signal 614 using the cascaded inverter buffers 603, 604, 605, 606, and 607. In one example, each inverter buffer 603, 604, 605, 606, and 607 may insert a ~5 ns delay. Non-overlapping clock 610 may further include NAND gate 608 coupled to receive the inverted signal 602 from inverter 603 and the inverted signal 602 with an additional delay from inverter 607. NAND gate 608 may output signal 614, which may be the non-inverted signal 602 with the additional delay. Non-overlapping clock 610 may further include a NAND gate 609 coupled to receive non-inverted signal 602 with no delay and non-inverted signal 602 from inverter 606. NAND gate 609 may output signal 612, which may be the inverted signal 602. Thus, gating signal 614 for the high side driving switches may be a non-overlapping complementary signal of gating signal 612. After inversion through inverter 613, gating signal 612 can be used to trigger generation of gating signal 629 for the low side driver switch 635A.

SOA adaptive gate driver 600 may further include a next cycle delay (latch) block 690, which may be used to implement next cycle delay 590, coupled to receive fault detect signal 691 and clock signal 692, and coupled to output SOA mode change signal 693. SOA mode change signal 693 may represent either a normal mode of operation or an SOA mode of operation in response to at a fault condition. SOA mode change signal 693 may be generated through the next cycle delay block 690 in response to a state change of fault detect signal 691 with some delay at the next rising edge of clock signal 692.

The SOA adaptive gate driver may further include control logic 620 (which may be used to implement control logic 520 of FIG. 5A) coupled to receive gating signal 614 and SOA mode change signal 693. Control logic 620 may be coupled to output one or both of selective gating signals 626 and/or 627 in response to SOA mode change signal 693. Control logic 620 may include NOR gate 622 coupled to receive SOA mode change signal 693 as input 618 and gating signal 614 as input 617. Control logic 620 may further include NOR gate 623 coupled to receive gating signal 614 as input 615 and an inverted SOA mode change signal 693 from inverter 621 as input 616. The outputs of NOR gates 622 and 623 may be coupled to the inputs of inverters 624 and 625, respectively, which may output gating signals 626 and 627. Gating signals 626 and 627 may be coupled to control high side switches MP1 631A and MP2 632A and may be complementary non-overlapping signals with sufficient dead gap between them to reduce or avoid shoot through current. Inverter 621 in control logic 620 may cause switches MP1 631A and MP2 632A to function in a complementary manner such that they do not turn on or off together/simultaneously. It should be appreciated that rising edges of the square wave gating signals (535 in FIGS. 5A and 5B) to the power MOSFET 140 in FIGS. 5A and 5B) may be generated by the driver high side switch(es) and falling edges of the square wave gating signals may be generated by the driver low side switch. The explanation below regarding selective coupling of the gate charging supply either in normal mode or SOA mode of operation refers only to the power MOSFET turn on (the power MOSFET gate capacitance charging period through the driver upper side switch(es)).

In one example, fault detect signal 691 during a normal mode of operation (no fault) may remain at a logic high, causing next cycle delay block 690 to output SOA mode change signal 693 at a logic high. In response, control logic 620 may activate gating signal 627 (logic low to turn on PMOS switch MP2 632A) and deactivate gating signal 626 (logic high to turn off PMOS switch MP1 631A). Inverter 621 in logic block 620 may cause MP1 631B and MP2 632B to function in a complementary manner such that they do not turn on or off together. As a result, switch MP2 632A in the driver circuit 630A turns on (and switch MP1 631A remains off) and a full gate voltage level (in one example >6V) is applied from the full gate voltage supply 680A (e.g., $V_{DD}$) as the output gate drive signal 695A.

In response to detecting a narrow high-amplitude drain current pulse (e.g., drain current pulse 323 in FIG. 3A), the fault detect signal 691 may change state (e.g., from a logic high to a logic low). Consequently, the SOA mode change signal 693 output by next cycle delay block 690 may also change state (e.g., from logic high to logic low) at the next rising edge of the clock signal 692. This results in control logic 620 activating gating signal 626 (logic low to turn on PMOS switch MP1 631A) and deactivating gating signal 627 (logic high to turn off PMOS switch MP2 632A). Thus, switch MP1 631A in driver circuit 630A turns on (and switch MP1 631A remains off) and applies an SOA mode reduced gate voltage level (e.g., 2.5-4V) from the SOA gate voltage supply 640 as the output gate drive signal 695A. In one example, SOA gate voltage supply 640 may generate the reduced SOA gate voltage level based on signal $I_{ref}$ 642, a reduced gate supply for SOA mode $VG_{SOA}$ 641, and a state change in SOA mode change signal 693 received at its input terminals.

SOA gate voltage supply 640 may be coupled to receive SOA mode change signal 693, signal $I_{ref}$ 642, and regulated voltage supply $VG_{SOA}$ 641 and may be coupled to output an SOA mode reduced gate voltage level to driver block 630A. The regulated voltage supply $VG_{SOA}$ 641 applies a reduced voltage level (e.g., a fixed 3-4V supply) to the driver in the SOA mode of operation through the Darlington pair BJT transistors Q3 657 and Q4 658. To compensate for the base-to-emitter voltage drop of BJT transistors Q3 657 and Q4 658 (which could be impacted by a temperature rise during a fault condition), the auxiliary BJT transistors Q1 647 and Q2 648 are coupled as diodes in series with the base-to-emitter voltage drop of BJT transistors Q3 657 and Q4 658 in a reverse direction to compensate. As mentioned above, SOA mode change signal 693 output by next cycle delay block 690 may change state (e.g., from logic high to logic low) in response to detecting a narrow high-amplitude drain current pulse (e.g., drain current pulse 323 in FIG. 3A). The change in state of SOA mode change signal 693 may cause transistor MP4 644 of SOA gate voltage supply 640 to turn on. While reference signal $I_{ref}$ 642 causes transistor MP 643 to be on and while transistor MP4 644 is turned on (due to the state change of signal 693 to logic low), current may be conducted from positive rail $V_P$ 649 to the negative rail $V_n$ 659 through self-biased diode connected NMOS transistor MN1 651. The current conduction through NMOS transistor MN1 651 may provide a bias voltage for NMOS transistor MN2, 652 to provide a second current path from positive rail $V_P$ 649 to negative rail $V_n$ 659 through the diode connected PMOS transistor MP5 645. The current conduction through PMOS transistor MP5 645 may bias for PMOS transistor MP6 646 to pull up the base of BJT transistor Q3 657, causing it to turn on. BJT transistors Q3 657 and Q4 658 form a Darlington pair and the turning on of transistor Q3 657 causes transistor Q4 658 to turn on. If, in driver block 630A, the high side PMOS switch MP1, 631 is off in the normal mode of operation, then the current path from positive rail $V_P$ 649 to negative rail $V_n$ 659 may be through BJT transistors Q3 657 and Q4 658 and NMOS transistors MN3 653 and MN4 654. However, in the SOA mode of operation during which switch MP1 631 is on, current may instead conduct through MP1 631 to charge the Power MOSFET through the gate signal 695.

While specific examples are provided above, it should be appreciated that variations to those examples may also be used. For example, multiple stages of NPN Darlington pairs may be used to automatically adjust the SOA mode reduced gate voltage level in response to temperature changes, as the base-to-emitter voltage may be temperature dependent. For example, with a full voltage gate drive supply of 5V under normal operation and by utilizing a 2-stage Darlington, the voltage at the second stage may be ~3.7V. Thus, under normal low temperature operation, the SOA mode reduced gate voltage level may be ~3.7V. While the 5V supply should be quite stable over a range of temperatures, the NPN base-emitter drop may increase with temperature. As a result, at higher temperatures under fault conditions, the SOA mode reduced gate voltage level may increase, while at lower temperatures, the SOA mode reduced gate voltage level may decrease. Due to a higher base-to-emitter voltage drop, the power MOSFET (e.g., MOSFET 140) saturation current may be lower at higher temperatures and higher at lower temperatures. By utilizing the NPN gate drive, the SOA mode reduced gate voltage level may compensate for the change in the power MOSFET saturation current and may help maintain the current at the same level for the possible range of temperature change.

FIG. 6B shows SOA mode adaptive driver 650 that includes non-overlapping clock 610, next cycle delay block 690, and control logic 620 that may be similar to their counterpart blocks/components in FIG. 6A. These blocks may include similar components and signals as those having the same labels in FIG. 6A. These blocks/components may function as described above with respect to FIG. 6A and their description will not be repeated below.

SOA mode adaptive driver 650 may further include a driver block 630B (which may be used to implement driver block 530B of FIG. 5B). Driver block 630B (gate current control) may be similar to driver block 630A (gate voltage control) except that driver block 630B may include an additional high side driver switch that may be selectively turned on or off to provide a variable current (charge) to the gate of the power MOSFET via output gate drive signal 695B.

In a normal mode of operation, fault detect signal 691 and SOA mode change signal 693 may remain at a logic high, as explained above with respect to FIG. 6A. Driver block 630B may include a low side NMOS switch MN5 635B and three high side PMOS switches MP1 631B, MP2 632B, and MP3 633B. As explained above with respect to FIG. 5B, PMOS switch MP3 633 may serve to provide a predefined minimum current (e.g., 33 mA) to the gate 144 of the power MOSFET 140. Similar to SOA mode gate driver 600 in FIG. 6A, control logic 620 may deactivate gating signal 626 (logic high to turn off PMOS switch MP1 631B) and activate gating signal 627 (logic low to turn on PMOS switch MP2 632B) in a normal mode of operation. This may cause a limited current $I_{G2}$ 637 (e.g., 40 mA) to be conducted from supply $V_{DD}$ 680 through PMOS switch MP2 632B, resulting in a total ($I_{G3}+I_{G2}$; e.g., 73 mA) gate charge current being injected from supply $V_{DD}$ 680 to gate 144. In a real implementation, a current limit through each high side switch of driver circuit 630B may be defined by a proper design of the width to length ratio (W/L) of conduction channels in switches MP1 631B, MP2 632B, and MP3 633B. This feature is represented by current supplies 581 and 582 in FIG. 5B.

In response to detection of a narrow high-amplitude drain current pulse (e.g., drain current pulse 323 in FIG. 3A) that is indicative of a fault condition, the fault detect signal 691 may change state (e.g., from a logic high to a logic low). Consequently, the SOA mode change signal 693 output by next cycle delay block 690 may also change state (e.g., from logic high to logic low) with some delay at the next rising edge of the clock signal 692, resulting in control logic 620 activating gating signal 626 (logic low to turn on PMOS switch MP1 631B) and deactivating gating signal 627 (logic high to turn off PMOS switch MP2 632B). Thus, switch MP1 631B in driver circuit 630B turns on (and switch MP1 632B remains off) and a lower value current $I_{G1}$ 636 (e.g., 11 mA) is conducted through PMOS switch MP1 631B from adaptive SOA gate current supply 660 (represented by 560 in FIG. 5B). A total current of ($I_{G3}+I_{G1}$; e.g., 44 mA) is injected from supply $V_{DD}$ 680 to the MOSFET gate 144. This may result in a lower slew rate and delayed turn on of the power MOSFET 140 as depicted in FIGS. 4A-D.

SOA gate current supply 660 may be coupled to receive SOA mode change signal 693 and signal $I_{ref}$ 662 and may be coupled to output the SOA mode reduced value current $I_{G1}$ 636. SOA mode reduced value current $I_{G1}$ 636 may be a temperature corrected current. As mentioned above, SOA mode change signal 693 output by next cycle delay block 690 may change state (e.g., from logic high to logic low) in response to detection of a narrow high-amplitude drain current pulse (e.g., drain current pulse 323 in FIG. 3A) in the drain current of the power MOSFET (e.g., drain current, $I_D$ 141 of switch 140 in FIG. 1A and FIGS. 5A/5B) at turn-on during the SOA time window after the blanking time window. The change in state of SOA mode change signal 693 causes transistor MP5 665 to turn on. While reference signal $I_{ref}$ 662 causes transistor MP4 664 to be on and while MP5 645 is on (through the state change of SOA mode change signal 693 to logic low), a limited current (e.g., 6.4 uA) may be conducted from supply $V_{DD}$ 680 to ground 601. This current may be partially adjusted by shunting resistor 665 and may then be conducted through the diode connected transistors MN1 671 and MN2 672 to be mirrored on transistor MN3 673. A mirror ratio between transistors MN2 672 and MN3 673 may be applied by adjusting the dimension ratio "W/L" of the transistors MN2 672 and MN3 673.

To minimize thermal error in operation and to compensate for the negative thermal coefficient effect of PMOS transistors MP4 664 and MP5 665 that may occur at high temperatures due to an output short circuit fault condition, two series NMOS transistors MN1, 671 and MN2, 672 with positive thermal coefficient may be included in the same current path.

In a normal mode of operation, SOA mode change signal 693 may remain at a logic high, causing transistor MN5 675 to pull down the gate of transistor MN3 673 to prevent current conduction through transistors MP6 666, MP7 667, and MP8 668. This prevents activation of the SOA adaptive gate current supply 660. However, in the SOA mode of operation, SOA mode change signal 693 may change state to a logic low, stopping switch MN5 675 from pulling down the gate of transistor MN3 673. As a result, the mirrored current from MN2 672 on MN3 673 may be conducted through the diode connected PMOS transistors MP6 666, MP7 667, and MP8 668 to activate transistor MP9 669 and to inject a predefined current to the high side switch MP1 631B of driver block 630B. In one example, the charging current may be 44 mA in the SOA mode of operation, while the full gate charge current may be 73 mA during normal operation.

The output signal 695B of the driver circuit 630B with adaptive current values in either normal mode or SOA mode of operation may be utilized to turn on the power MOSFET.

Figure 7A:
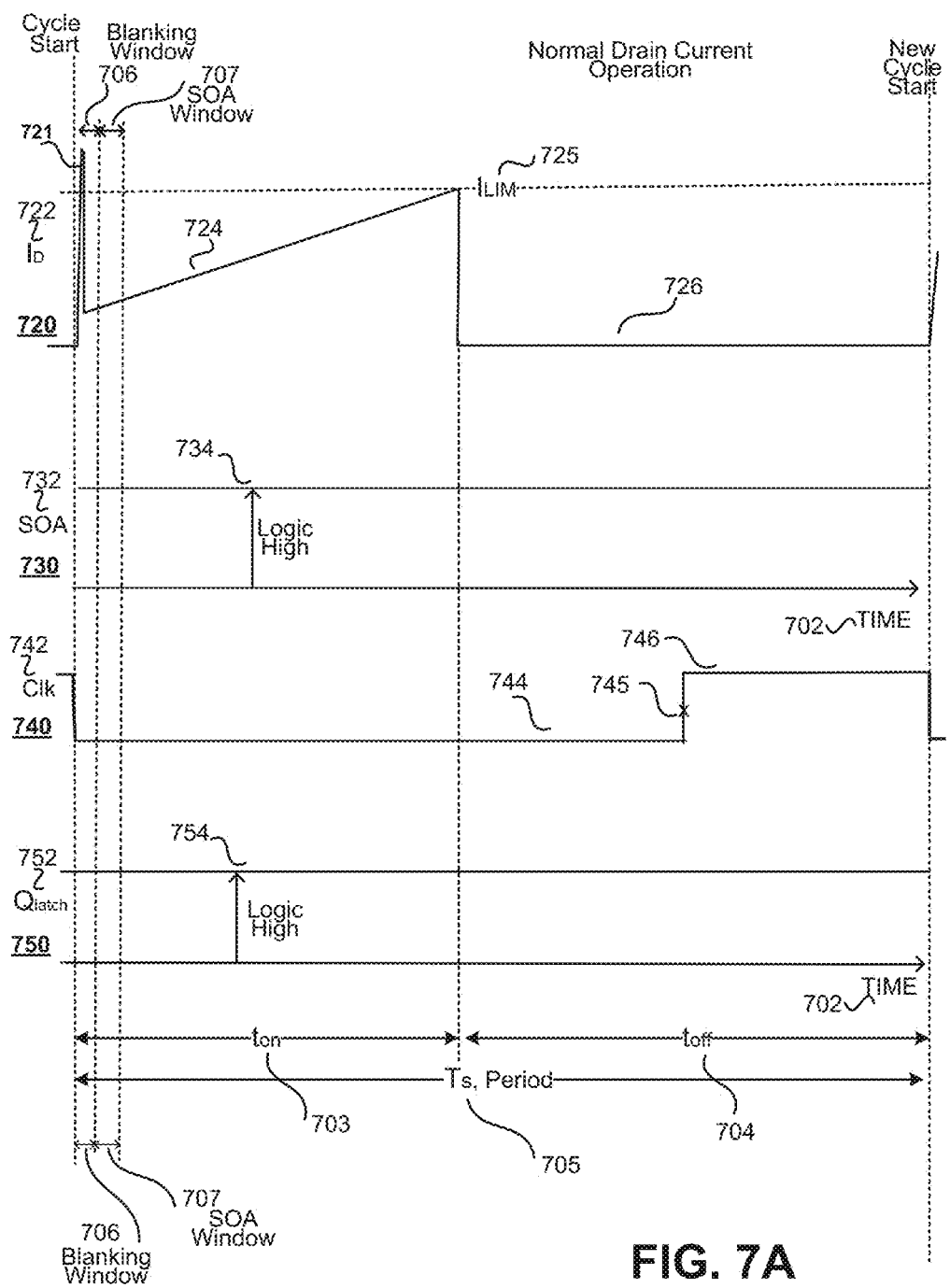
FIG. 7A shows example waveforms of the drain current and associated control signals in the SOA adaptive gate driver of FIGS. 5A, 5B, 6A, and 6B during normal operation.
Figure 7B:
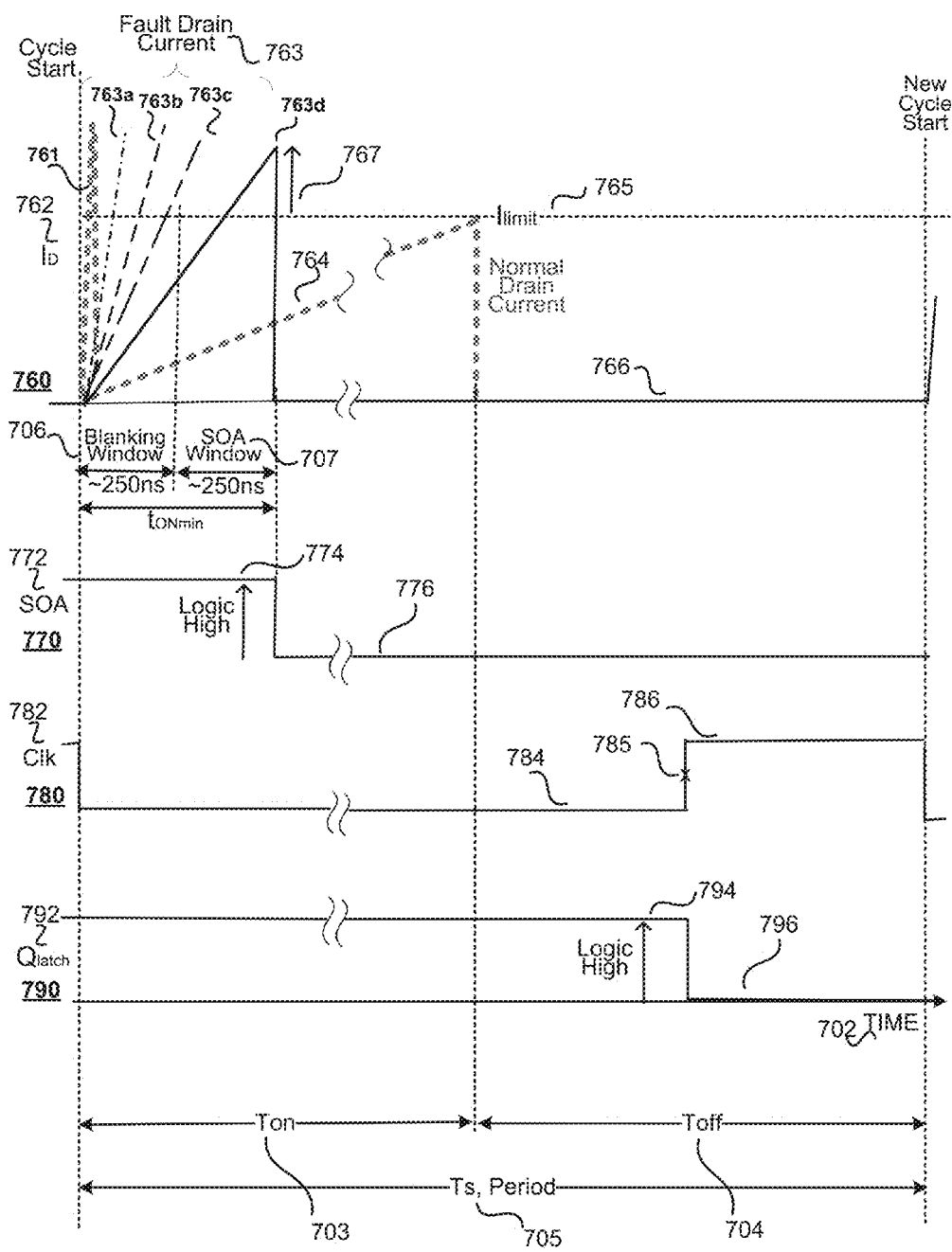
FIG. 7B shows example waveforms of the drain current and associated control signals in the SOA adaptive gate driver of FIGS. 5A, 5B, 6A, and 6B during a fault condition.

FIGS. 7A and 7B illustrate example drain current pulses and control signals of an SOA adaptive gate driver block. FIG. 7A illustrates a sample waveform of one switching cycle of the drain current pulse and associated control signals during normal operation (no fault). On the horizontal time axis 702, a single switching cycle is represented by $T_s$, period 705 consisting of on-time $T_{on}$ 703 and off-time $t_{off}$ 704. At normal operation, the drain current pulse may have a wide on-time and the peak current may not exceed the SOA threshold. At turn-on, there may be a narrow, high amplitude turn-on spike (721 on graph 720) that may exceed the current limit, $I_{LIM}$ 725 due to the release of transformer leakage energy. However, due to the narrow blanking time window 706 that blanks and prevents any detection of a fault by the fault detector at the start of each switching cycle, the turn-on spike may not activate the SOA mode of operation. Thus, the SOA fault detect signal 732 (e.g., input 691 of next cycle delay block 690 in FIG. 6A and FIG. 6B) remains high during the entire switching cycle. Clock signal 742 (e.g., input 692 of next cycle delay block 690 in FIG. 6A or FIG. 6B) may switch regularly at each switching cycle.

In one example, blanking time window 706 may be followed by a second short interval 707 (SOA time window) for the SOA detection. As shown in graph 720, drain current $I_D$ 722 includes a turn-on current spike 721 that occurs during blanking time window 706 and thus, does not trigger the SOA mode of operation. Drain current $I_D$ 722 then drops to a normal operation current level and increases with a relatively low slope 724 based on the input voltage and inductance. When the drain current reaches the current limit $I_{LIM}$ 725, the on-time $t_{on}$ 703 ends and drain current $I_D$ 722 drops to almost zero (i.e., level 726) during switch off-time $t_{off}$ 704. In normal operation when no current spike representative of a fault condition is detected in SOA time window 707, signal SOA 732 on graph 730 (e.g., input 691 to next cycle delay block 690 in FIG. 6A and FIG. 6B) may remain at a high logic level 734. The clock signal clk 742 on graph 740 (e.g., input 692 to next cycle delay block 690 in FIG. 6A and FIG. 6B) may switch normally from low level 744 to high level 746 with rising edge 745. However, the output of next cycle delay block 690, which is illustrated as $Q_{latch}$ 752 on graph 750, may remain at a high logic level 754, resulting in no activation of the SOA mode of operation.

FIG. 7B illustrates a sample waveform of one switching cycle of the drain current pulse and associated control signals during a fault condition. Graph 760 illustrates examples of narrow high amplitude drain current pulses 763 (763a, 763b, 763c, and 763d) that may occur during a fault condition within the blanking or SOA time windows 706 and 707. As a reference for comparison, the ramp up of the drain current pulse during normal operation is illustrated by the dashed line 764. The broken time line illustrates the blanking and SOA time windows in an expanded time scale. The peak of normal condition current pulse 764 with low rising slope may be limited by current limit $I_{LIM}$ 765. However, it should be appreciated that the turn-on spike 761 or any other high amplitude current pulses (e.g., 763a or 763b) in the blanking time window 706 may be ignored even though they may exceed current limit $I_{limit}$ 765.

During a fault condition, a current pulse (e.g., 763d) that exceeds $I_{limit}$ (e.g., by an amount 767) in the SOA time window 707 may be detected by fault detection circuitry. This may cause the SOA mode of operation to be activated and may cause the fault detect signal 772 on graph 770 to change from logic high level 774 to logic low level 776 at the end of SOA time window 707. The clock signal clk 782 on graph 780 changes state from low level 784 to high level 786 at rising edge 785.

Next cycle delay block 690 in FIG. 6A and FIG. 6B, may receive fault detect signal 772 (represented by signal 691 in FIGS. 6A and 6B), which may change state from logic high level 774 to logic low level 776, and may output signal $Q_{latch}$ 792 shown in graph 790 that may change state from logic high level 794 to logic low level 796 at the rising edge 785 of clock signal 782, which may also be received by next cycle delay block 690. The rising edge 785 of clock signal 782 on graph 780 is marked by a cross sign when clock signal 782 changes from logic low level 784 to logic high level 786. The state change of output signal $Q_{latch}$ 792 of the next cycle delay block 690 may result in the activation of the SOA mode of operation with some delay after the close of SOA time window 707 and at the next rising edge 785 of clock signal 782. By changing state from logic high level 794 to logic low level 796, the output signal $Q_{latch}$ 792 may activate the SOA adaptive gate driver as described above with respect to the logic circuit block diagrams of FIGS. 6A and 6B The above description of illustrated examples of the present invention, including what is described in the Abstract, are not intended to be exhaustive or to be a limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A device comprising:
    an adaptive gate driver for a switch mode power converter controller, the adaptive driver configured to drive a power transistor of the switch mode power converter with first gate drive pulses in a normal range of operating conditions, the first gate drive pulses each allowing a saturation region drain current through the power transistor to exceed a safe operating area of the power transistor during a fault condition, the adaptive gate driver comprising:
        an input to be coupled to receive a signal indicative of a fault condition; and
        control logic coupled to respond to an indication of the fault condition by adapting the driving of the power transistor so that the power transistor is driven with a second gate drive pulse with reduced strength; the second gate drive pulse having at least one of:
            a lower voltage than the first gate drive pulses, and
            a lower current than the first gate drive pulses;
    so that a saturation region drain current through the power transistor remains within the safe operating area of the power switch.

2. The device of claim 1 wherein after the power transistor turns on an SOA time window is defined after a blanking time window, wherein during the blanking time window no high amplitude drain current pulse may be detected to trigger the fault condition, and wherein any high amplitude drain current pulse exceeding a current limit of the switch mode power converter during the SOA time window indicates a fault condition and at the end of SOA time window changes state of a fault detect signal to transition the gate driver from normal mode of operation with a normal steady timing pattern and normal full strength first gate drive pulses to an SOA mode of operation with an SOA timing pattern and reduced strength second gate drive pulses.

3. The device of claim 2, wherein:
the adaptive gate driver is coupled to drive the power transistor with full strength gate voltage and current at the normal steady timing pattern in the normal range of operating conditions;
the device further comprises:
a cycle delay circuitry coupled to receive the signal indicative of the fault condition and, in response to the indication of the fault condition, extend the power transistor off time before the next gate drive pulse to drive the power transistor at the SOA timing pattern with the second gate drive pulse.

4. The device of claim 3, wherein the control logic is coupled to a first voltage supple and a second voltage supply, the second voltage supply having a value less than a value of the first voltage supply, and wherein the control logic circuit is operable to output the first gate drive pulses using the first voltage supply and to output the second gate drive pulses using the second voltage supply.

5. The device of claim 4, wherein the adaptive gate driver comprises:
a first switch coupled to the first voltage supply;
a second switch coupled to the second voltage supply; and
a third switch, wherein the third switch is coupled between a ground reference level and the first and second switches.

6. The device of claim 5, wherein the control logic is coupled to output a first gating signal to control the first switch and coupled to output a second gating signal to control the second switch, and wherein the control logic is operable to cause the first switch to turn on using the first gating signal and to cause the second switch to turn off using the second gating signal while the control logic is operating in the normal mode of operation, and wherein the control logic circuit is operable to cause the first switch to turn off using the first gating signal and to cause the second switch to turn on using the second gating signal while the control logic circuit is operating in the SOA mode of operation in response to a fault condition detection.

7. The device of claim 6, further comprising:
a next cycle delay circuit coupled to output an SOA mode change signal to the control logic circuit;
a non-overlapping clock circuit coupled to output a third gating signal to the control logic and to output a fourth gating signal, wherein the control logic is operable to operate in either the normal mode of operation or the SOA mode of operation based on the SOA mode change signal and the third gating signal; and
an inverter coupled to receive the fourth gating signal and coupled to output a fifth gating signal to control the third switch.

8. The device of claim 7, wherein the next cycle delay circuit is coupled to receive a clock signal and a fault detection signal, wherein the next cycle delay circuit is configured to change a state of the SOA mode change signal in response to a state change of the fault detection signal at a next rising edge of the clock signal.

9. The device of claim 7, wherein the third gating signal is a complement of the fourth gating signal.

10. A switch mode power converter including:
an adaptive gate driver circuit coupled to output a drive signal to control a power transistor; and
a control logic circuit coupled to control the adaptive gate driver circuit, wherein the control logic circuit is operable to cause the adaptive gate driver circuit to output the drive signal with a first drive current while the control logic circuit is operating in a normal mode of operation, and wherein the control logic circuit is operable to cause the driver circuit to output the drive signal with a second drive current that is less than the first drive current while the control logic circuit is operating in an SOA mode of operation in response to detecting a fault condition.

11. The switch mode power converter of claim 10, wherein detecting the fault condition comprises detecting a drain current that exceeds a current limit threshold during an SOA time window after the power switch turns on.

12. The switch mode power converter of claim 11, wherein the SOA time window occurs after a blanking time window after the power transistor turns on.

13. The switch mode power converter of claim 10, wherein the adaptive gate driver circuit comprises:
a first switch coupled to a voltage supply;
a second switch coupled to the voltage supply;
a third switch coupled to a current supply; and
a fourth switch, wherein the fourth switch is coupled between a reference level and the first, second, and third switches.

14. The switch mode power converter of claim 13, wherein the control logic circuit is coupled to output a first gating signal to control the first switch, coupled to output a second gating signal to control the second switch, and a third gating signal to control the third switch.

15. The switch mode power converter of claim 14, wherein the control logic circuit is operable to cause the first switch to turn on using the first gating signal, to cause the second switch to turn on using the second gating signal, and to cause the third switch to turn off while the control logic circuit is operating in the normal mode of operation, and wherein the control logic circuit is operable to cause the first switch to turn on using the first gating signal, to cause the second switch to turn off using the second gating signal, and to cause the third switch to turn on using the third gating signal while the control logic circuit is operating in the SOA mode of operation.

16. The switch mode power converter of claim 15, wherein the first drive current comprises a current conducted through the first switch and a current conducted through the second switch while the control logic circuit is operating in the normal mode of operation, and wherein the second drive current comprises the current conducted through the first switch and a current conducted through the third switch while the control logic circuit is operating in the SOA mode of operation.

17. The switch mode power converter of claim 16, wherein the current conducted through the second switch while the control logic circuit is operating in the normal mode of operation is greater than the current conducted through the third switch while the control logic circuit is operating in the SOA mode of operation.

18. The switch mode power converter of claim 16, further comprising:
a next cycle delay circuit coupled to output an SOA mode change signal to the control logic circuit;
a non-overlapping clock circuit coupled to output a fourth gating signal to the control logic circuit and to output a fifth gating signal, wherein the control logic circuit is operable to operate in either the normal mode of operation or the SOA mode of operation based on the SOA mode change signal and the fourth gating signal; and
an inverter coupled to receive the fifth gating signal and coupled to output a sixth gating signal to control the fourth switch.

19. The switch mode power converter of claim 18, wherein the next cycle delay circuit is coupled to receive a clock signal and a fault detection signal, wherein the next cycle delay circuit is configured to change a state of the SOA mode change signal in response to a state change of the fault detection signal at a next rising edge of the clock signal.

20. The switch mode power converter of claim 19, wherein the fifth gating signal is a complement of the fourth gating signal.

21. The switch mode power converter of claim 13, wherein the current supply is a temperature compensated current supply that outputs a constant current that compensated versus temperature change of the current supply.

\* \* \* \* \*